United States Patent
Tomita et al.

(10) Patent No.: US 6,620,285 B2
(45) Date of Patent: Sep. 16, 2003

(54) METHOD FOR BONDING SUBSTRATES

(75) Inventors: Shinichi Tomita, Saga (JP); Shuhei Tsuda, Saga (JP); Yasunobu Ikeda, Saga (JP)

(73) Assignee: Sumitomo Metal Industries, Osaka (JP)

(*) Notice: Subject to any disclaimer, the term of this patent is extended or adjusted under 35 U.S.C. 154(b) by 51 days.

(21) Appl. No.: 09/972,851

(22) Filed: Oct. 10, 2001

(65) Prior Publication Data

US 2002/0040754 A1 Apr. 11, 2002

(51) Int. Cl.$^7$ ................................................ B29C 65/00
(52) U.S. Cl. ...................... 156/285; 156/539; 156/556; 156/580
(58) Field of Search .............................. 156/285, 538, 156/539, 556, 580, 581, 583.1

(56) References Cited

U.S. PATENT DOCUMENTS

| | | | | |
|---|---|---|---|---|
| 4,352,712 A | * | 10/1982 | Paul | 156/540 |
| 4,353,775 A | * | 10/1982 | Paul | 156/540 |
| 4,419,168 A | * | 12/1983 | Paul | 156/351 |
| 5,997,688 A | * | 12/1999 | Wawrzyniak | 156/583.1 |
| 6,287,414 B1 | * | 9/2001 | Green et al. | 156/583.1 |

* cited by examiner

*Primary Examiner*—James Sells
(74) *Attorney, Agent, or Firm*—Kanesaka & Takeuchi (57) ABSTRACT

A method for bonding substrates to tightly bond two overlaid substrates comprises the steps of: aligning the substrates, freely falling a second substrate onto a first substrate to overlay the first and second substrates; interposing an air layer between the joining surfaces of the first and second substrates, aligning the first and second substrates and holding the aligned first and second substrates; and pressing one point of the aligned two substrates. Thus, the bonded substrates which can be aligned accurately and free from occurrence of voids or the like can be obtained.

7 Claims, 6 Drawing Sheets

METHOD FOR BONDING SUBSTRATES

BACKGROUND OF THE INVENTION

The present invention relates to a method of tightly bonding two substrates.

Conventionally, a joint substrate which is formed by tightly bonding two substrates is used widely. For example, there is known an SOI (silicon on insulator) substrate which is formed by joining two semiconductor substrates with an oxide film ($SiO_2$) interposed therebetween and thinning the semiconductor substrate on the activation side. The SOI substrate is used as a substrate for a semiconductor device having effects of a high withstand voltage, a high speed, etc.

When two substrates are overlaid, the substrate on the top is in a state floating on a gas present on the lower substrate. Therefore, friction produced when the top substrate moves on a horizontal plane is very small, so that the two substrates are displaced even if there is a little inclination. To align the two substrates accurately without displacing them, it is necessary to provide means for limiting the movement of the upper substrate.

Figure 6:
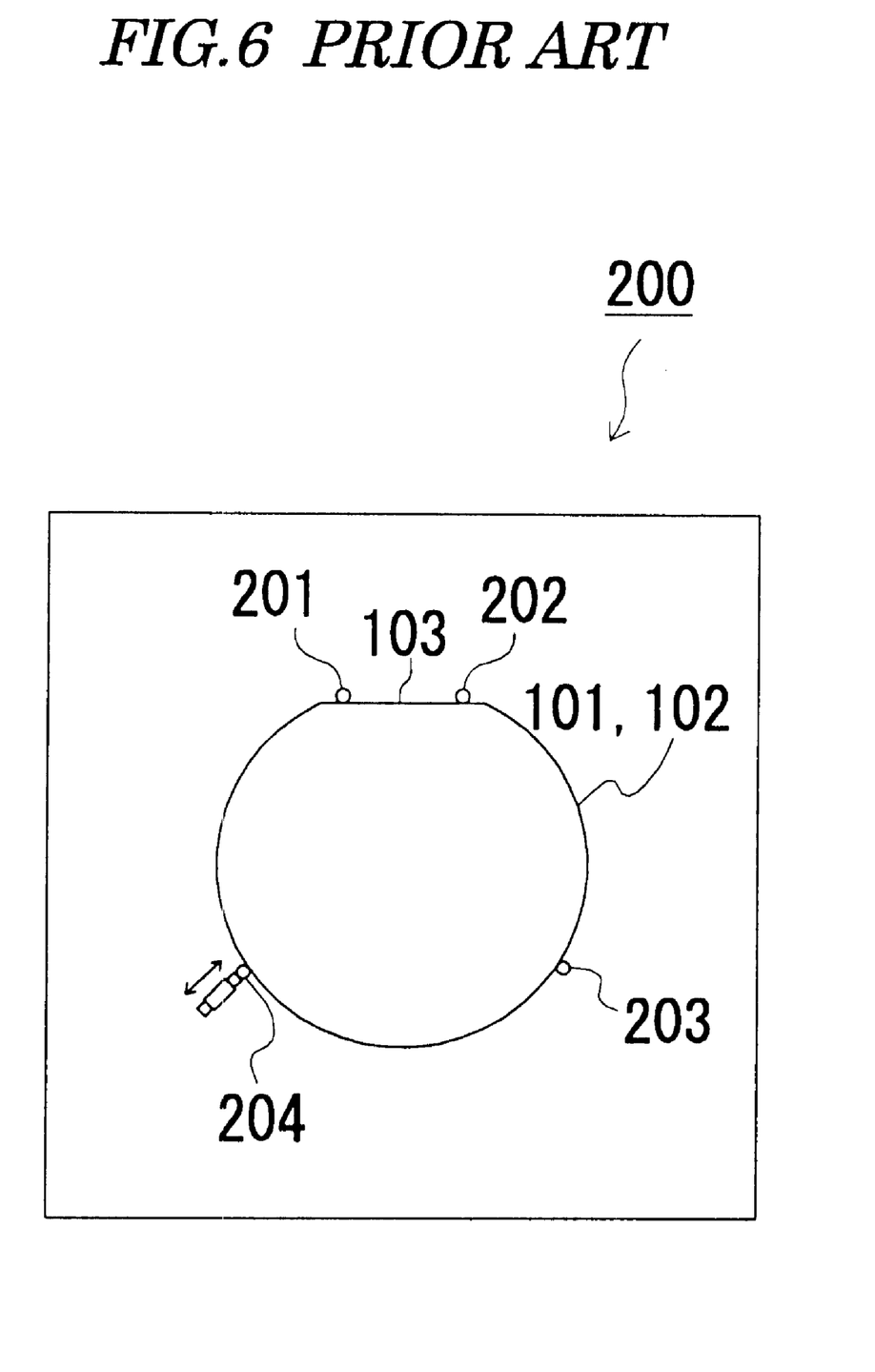
FIG. 6 is a plan view showing a substrate bonding jig according to the prior art.

As means for controlling the movement of the substrates, for example, a plurality of positioning pins 201, 202, 203 and a pressing pin 204 are disposed around the two overlaid substrates 101, 102 positioned on a jig 200 to control the horizontal movement of the substrates as shown in FIG. 6. They are bonded by being left standing for a predetermined time.

But, when the movement of the substrates 101, 102 is controlled by the plurality of positioning pins 201, 202, 203 and the pushing pin 204 disposed around them, the substrates are in contact with the pins, and joining of the substrates are disturbed at the contact portions, possibly resulting in a disadvantage such as occurrence of voids or particles.

For example, when the movement of the substrates 101, 102 is controlled by pushing them by the pushing pin 204 and its pushing force is excessive, joining of the substrates 101, 102 is impaired around the contact portions with the pushing pin 204, causing a problem that voids are produced.

When the number of pins for positioning is decreased, an orientation flat section (hereinafter called "OF section") of the two substrates is displaced or a notch section is displaced, causing a disadvantage that a rate of defective products increases.

When joining of the two substrates is started from many joining points on a joining interface between the two substrates, there is a problem that voids tend to be produced on the joining interface. This method also has a drawback that its bonding time is long because the substrates are left standing to join together.

Therefore, it is an object of the present invention to provide a method for bonding substrates which can make accurate positioning, does not produce voids or the like and has a short bonding time.

SUMMARY OF THE INVENTION

The present invention is a method for bonding substrates to tightly bond two overlaid substrates which comprises the steps of:

aligning the substrates, freely falling a second substrate onto a first substrate to overlay the first and second substrates;

interposing an air layer between joining surfaces of the first and second substrates, aligning the first and second substrates and holding the aligned first and second substrates; and pressing one point of the aligned two substrates.

Thus, interposing the air layer between the joining surfaces of the first substrate and the second substrate facilitates the movement of the second substrate to be placed on the first substrate and enables free movement of the second substrate. Thus, the two substrates can be aligned accurately.

By pressing one point of the two substrates which are accurately aligned, a high quality product can be produced without producing voids or the like on the joining interface between the two substrates and a bonding time can be shortened unlike the case that joining is started from a plurality of joining points.

The present invention is a method for bonding substrates, wherein in the above step of interposing the air layer between the joining surfaces of the first and second substrates, aligning them and holding the aligned first and second substrates, the alignment is made by pressing at least one of the first and second substrates to form the air layer between the joining surfaces of the first and second substrates.

For example, when the second substrate is freely fallen to be placed on the first substrate, the joining surfaces of the first substrate and the second substrate are occasionally adhered at several points. According to the present invention, when at least one of the first and second substrates is pressed to move in order to align them, the several joined points adhering the first substrate and the second substrate are separated to form a constant air layer.

The present invention is a method for bonding substrates, wherein in the step of interposing the air layer between the joining surfaces of the first and second substrates, aligning them and holding the aligned first and second substrates, the first substrate is placed on a mounting table by adsorbing; and the adsorption of the first substrate is released to form the air layer between the joining surfaces of the first and second substrates.

Thus, when the first substrate is adsorbed to position on the mounting table, it is caused to swing by releasing its adsorption, the second substrate which is partially adhered to the first substrate is separated, and a constant air layer is formed between the first and second substrates.

The present invention is a method for bonding substrates, wherein in the step of interposing the air layer between the joining surfaces of the first and second substrates, aligning them and holding the aligned substrates, the alignment is performed by applying a pressing force to at least a part of the substrates, and the substrates are held. Then, the pressing force is lower than a force of naturally adhering the first and second substrates.

When the pressing force applied to the first and second substrates to align and hold them is higher than the force of naturally adhering the two substrates, joining at the portion to which the pressing force is applied is impaired, resulting in causing voids. Therefore, a high quality bonded substrate free from voids can be obtained by aligning and holding the substrates by the pressing force which does not impair the joining of the first and second substrates, namely a pressing force not producing voids.

According to the present invention, the air layer interposed between the joining surfaces of the first and second substrates is uniform.

Thus, when the air layer interposed between the joining surfaces of the first and second substrates is uniform, a high quality bonded substrate free from voids can be obtained.

DESCRIPTION OF PREFERRED EMBODIMENTS

Embodiments of the present invention will be described in detail with reference to the accompanying drawings.

Figure 1:
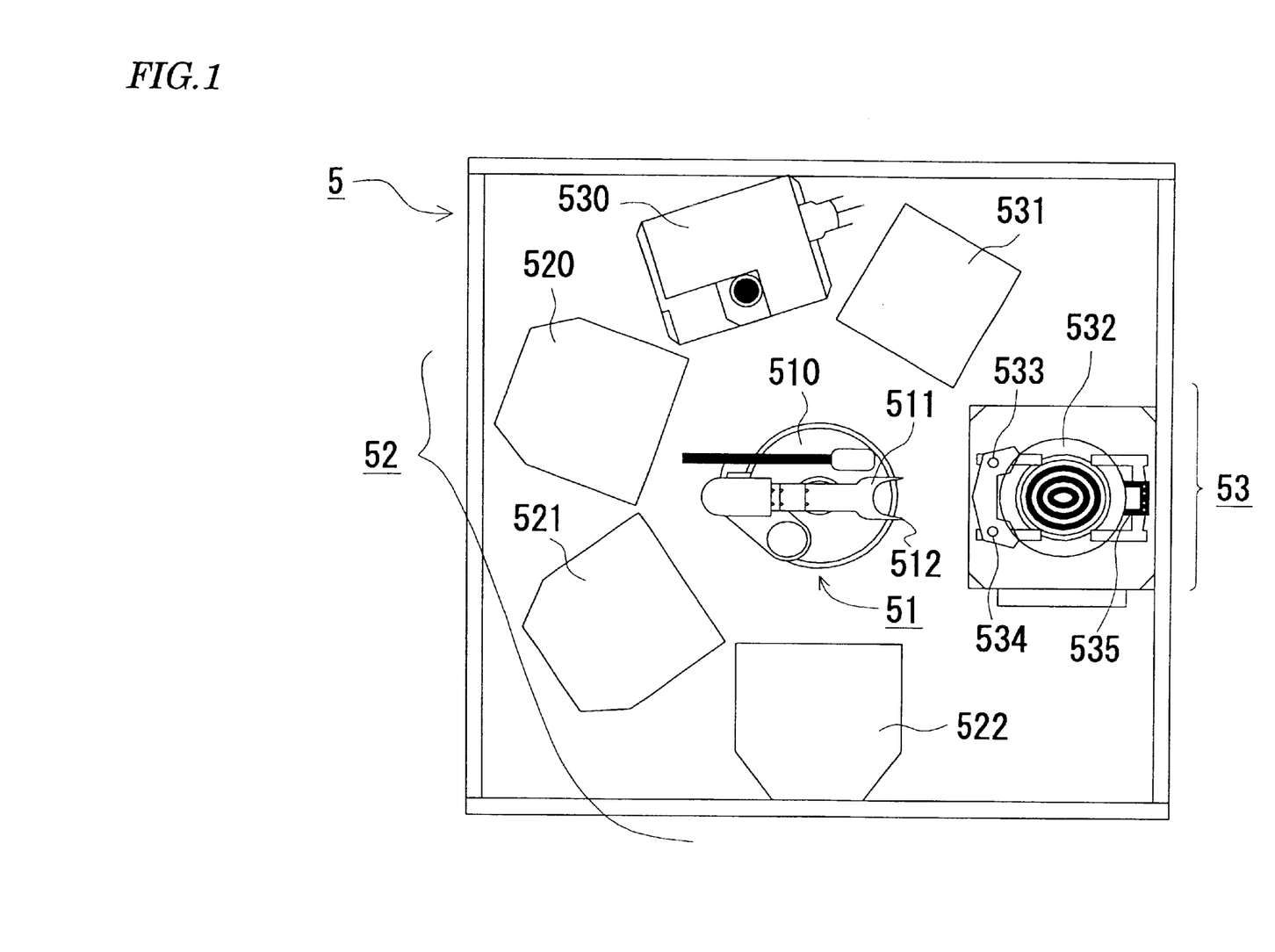
FIG. 1 is a plan view showing a device for bonding substrates according to an embodiment of the present invention.

FIG. 1 is a plan view showing an embodiment of a device for bonding substrates of the present invention. A device 5 for bonding substrates comprises conveying means 51 for conveying substrates, housing means 52 for housing substrates, and bonding means 53 for bonding two substrates.

The conveying means 51 has a drive section 510 for driving the conveying means, and a robot arm 511 which is mounted on the drive section 510 and driven to freely turn by a drive force of the drive section 510. This robot arm 511 is provided at its forward end with an adsorbing section 512 for adsorbing a substrate. The robot arm 511 adsorbs the substrate by the adsorbing section 512 and conveys it to a predetermined position. The robot arm also has a function to turn over the adsorbed wafer.

The housing means 52 is configured to have a plurality of housing cassettes 520, 521, 522 on the circumference of a concentric circle about the drive section 510 and the robot arm 511 as the center. For example, the housing cassette 520 houses a first substrate, prior to be bonded, with its mirror finished surface upward, and the housing cassette 521 houses a second substrate with its mirror finished surface upward so as to be bonded with the first substrate. The housing cassette 522 houses the bonded substrates.

The bonding means 53 is disposed adjacent to the housing cassette 522. The bonding means 53 is provided with an aligner 530, a weight station 531, a mounting table 532 for placing a substrate thereon, aligning pins 533, 534 which are driven by a drive means (not shown) to position a substrate, and a pressing pin 535.

The aligner 530 has functions to detect the center of the substrate and its orientation and to accurately detect the OF section and notch section of the two substrates.

The weight station 531 has a weight for pressing the two overlaid substrates.

The mounting table 532 may have a shape of either a convex spherical shape or a flat shape. The mounting table 532 may also have a function to adsorb the substrate to the mounting table.

Then, a method of bonding two substrates by the bonding device 5 will be described.

The two substrates 1, 2 to be bonded may be any type of substrate of single-crystalline silicon, polycrystalline silicon, quartz, etc., and the presence or absence of an oxide film on the substrate surface does not matter. But, it is desirable to use a substrate having a good surface shape because voids are produced depending on the surface shapes of the substrates 1, 2. For example, the substrates 1, 2 to be bonded are thoroughly washed to have a good state without the presence of particles or the like on the surfaces.

The bonding process is performed in an atmosphere free from dust.

Step 1

First, step 1 to align the substrates and to place them on the mounting table will be described.

In the step 1, the robot arm 511 adsorbs to hold the substrate 1 housed in the housing cassette 520 by the adsorbing section 512 and conveys it onto the mounting table 532 of the bonding means 53.

Then, the robot arm 511 adsorbs to hold the substrate 2 housed in the housing cassette 521 by the adsorbing section 512, turns it over while conveying the substrate 2 to have the mirror finished surface downward, and places it on the first substrate 1 placed on the mounting table 532 of the bonding means 53.

The robot arm 511 releases the adsorption above the first substrate 1 to freely drop the second substrate 2 so as to overlay the first and second substrates 1, 2 mutually. At this time, it is necessary to adjust the robot arm 511 to a height so that the second substrate 2 drops freely without damaging, cracking or displacing the first and second substrates. And, the aligning pins 533, 534, 535 are disposed at positions which are wider than the substrates by 1 to 2 mm.

The centers and orientations of the first and second substrates 1, 2 to be conveyed are detected by the aligner 530 and properly positioned on the mounting table 532.

Step 2

Then, step 2, in which an air layer is uniformly interposed between the joining surfaces of the first and second substrates 1, 2 placed on the mounting table 532, and the first and second substrates 1, 2 are aligned and held, will be described.

FIG. 2(a) is an explanatory diagram showing a state that the second substrate 2 is freely dropped and positioned on the first substrate 1, and FIG. 2(b) is an explanatory diagram showing a state that the uniform air layer is formed between the joining surfaces of the first and second substrates by aligning, which is to be described later.

Figure 3:
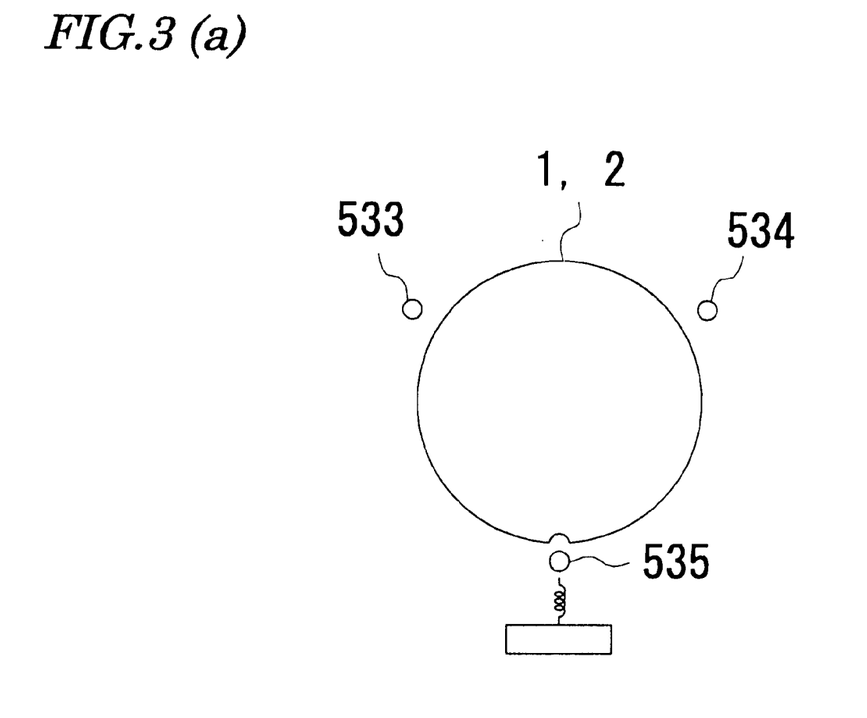
FIG. 3(a) is an explanatory diagram showing a state that two substrates are not aligned yet.
FIG. 3(b) is an explanatory diagram showing a state that the two substrates are aligned and held according to an embodiment of the invention.

FIG. 3 is an explanatory diagram showing a state that the two substrates are aligned by the pressing pin 535 and the aligning pins 533, 534.

As shown in FIG. 2(a), the second substrate 2 freely dropped and positioned on the first substrate 1 which is placed on the mounting table 532 might come into contact with the first substrate 1 at a plurality of adhering points 3. When the bonding of the first and second substrates 1, 2 is started in the state that the first substrate 1 and the second substrate 2 are contacted at the plurality of adhering points 3, the first and second substrates 1, 2 do not uniformly adhere to each other on the joining surfaces, and a void X is likely to occurr between the first adhering points 3.

Figure 2:
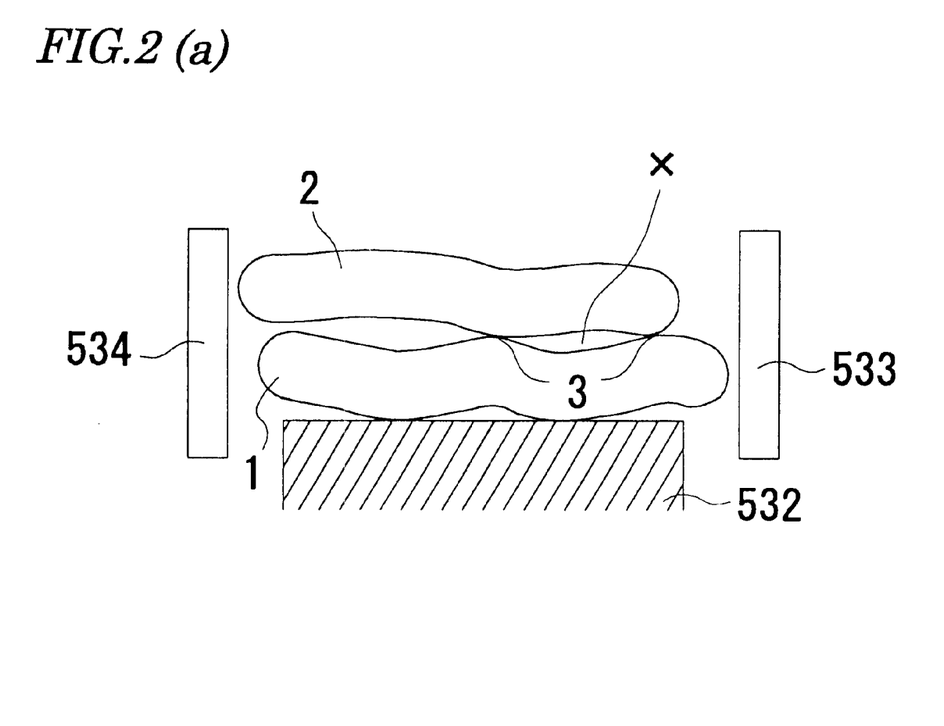
FIG. 2(a) is an explanatory diagram showing a state that a second substrate 2 is freely fallen to be placed on a first substrate 1.
FIG. 2(b) is an explanatory diagram showing a state that a uniform air layer is formed between joining surfaces of the first and second substrates according to an embodiment of the invention.

Therefore, a part of the overlaid substrates 1, 2, namely a notch in this embodiment, is pressed by the pressing pin 535 to align the substrates 1, 2 as shown in FIG. 3(*a*). When the substrates 1, 2 are aligned, the substrates 1, 2 are moved, the adhered points 3 are separated as they are moved, and a uniform air layer 4 is formed between the joining surfaces of the substrates 1, 2 as shown in FIG. 2(*b*).

As shown in FIG. 3(*b*), after the substrates 1, 2 are aligned by the pressing pin 535, they are stably held by the aligning pins 533, 534 and the pressing pin 535. Thus, the substrates 1, 2 are not displaced.

The pressing pin 535 is configured to provide a variable pressing force by a drive means (not shown). Therefore, the pressing pin 535 can change the pressing force to hold the substrates 1, 2. For example, when the pressing force of the pressing pin 535 is larger than an adhering force of the substrates 1, 2, joining around the points with which the pressing pin 535 and the aligning pins 533, 534 are in contact is impaired, resulting in occurrence of voids.

Therefore, the pressing force of the pressing pin 535 is varied to stably hold the substrates 1, 2 by a force lower than the force of adhering the substrates 1, 2 by means of the aligning pins 533, 534 and the pressing pin 535, thereby preventing voids from occurring.

In this embodiment, the substrates are pressed by a coil spring disposed on the pressing pin 535. Means for applying the pressing force is not limited to the coil spring of this embodiment but an elastic member such as rubber, liquid or the like may be used. The pressing force may be produced by torque of a motor and varied by adjusting the torque.

The aligning pins 533, 534 and the pressing pin 535 are desirably configured to have a less contact portion with the substrates 1, 2 in order to prevent the occurrence of voids. For example, when the substrates 1, 2 are held by pillar-shaped pins, they are held on point contacts, and entry of a foreign substance between the joining surfaces of the substrates 1, 2 can be decreased. Pins are made of such a material as Teflon or the like which is free from dust production, contamination or the like.

In this embodiment, the substrates are held at three points by the aligning pins 533, 534 and the pressing pin 535 so as to minimize the contact points with the substrates as small as possible. Thus, occurrence of voids which tend to be produced on the joining surfaces is prevented.

Besides, the pressing pin 535 of this embodiment can align accurately the substrates 1, 2 while preventing the substrates 1, 2 from displacing because it holds them so as to agree with the notches of the substrates 1, 2.

Step 3

Lastly, step 3 to bond the overlaid first and second substrates 1, 2 by pressing one point thereof will be described.

First, the weight disposed on the weight station 531 is adsorbed and held by the robot arm 511 and conveyed onto the mounting table 532.

Placing the weight on the overlaid substrates presses one point of the substrates 1, 2 to start bonding them on the mounting table 532.

As a method of pressing one point of the first and second substrates 1, 2, a rod type having vertical or rotation drive means may be used to press one point.

When pressing is started from one point on the overlaid first and second substrates 1, 2 as in this embodiment, occurrence of voids due to the start of joining at multiple points can be prevented, and a high quality product without voids on the joining surfaces can be produced.

Lastly, the bonded substrates are conveyed to the housing cassette 522 by the robot arm 511, and the process of bonding substrates is completed.

Then, with reference to FIG. 4, another embodiment of the step 2, which interposes a uniform air layer between the joining surfaces of the first and second substrates 1, 2 placed on a mounting table 632, aligns the first and second substrates 1, 2 and holds them, will be described.

Figure 4:
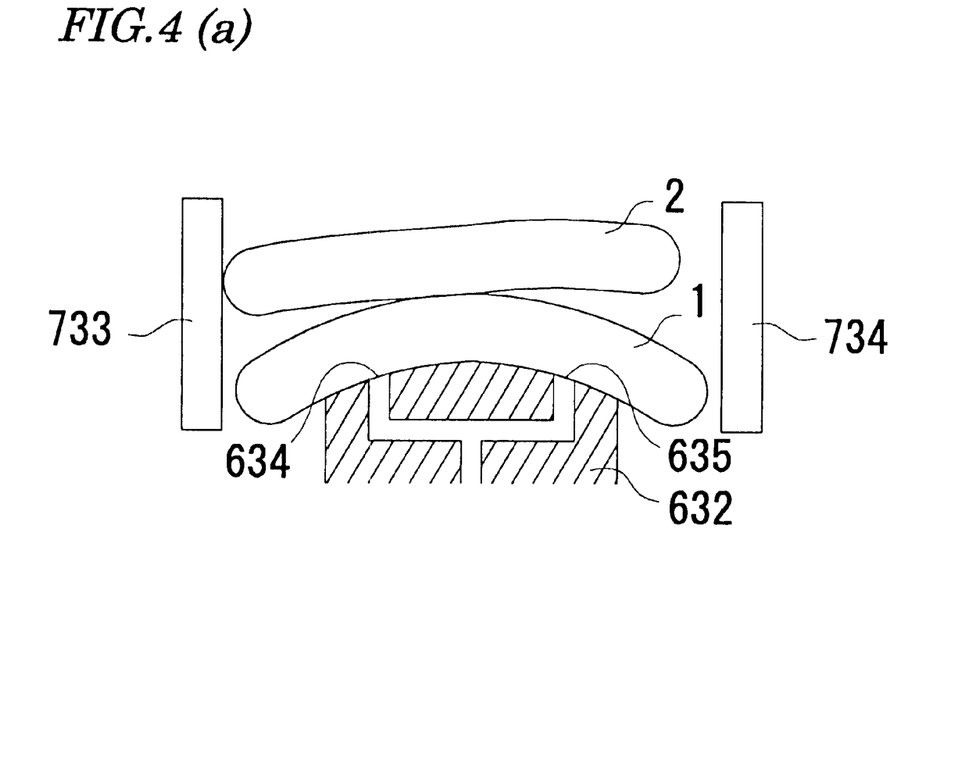
FIG. 4(a) is an explanatory diagram showing a state that the second substrate 2 is freely fallen to be placed on the first substrate 1.
FIG. 4(b) is an explanatory diagram showing a state that a uniform air layer is formed between joining surfaces of the first and second substrates by an aligning step to be described later according to an embodiment of the invention.

FIG. 4(*a*) is an explanatory diagram showing a state that the second substrate 2 is freely fallen and positioned on the first substrate 1, and FIG. 4(*b*) is an explanatory diagram showing a state that a uniform air layer is interposed between the joining surfaces of the first and second substrates by an aligning process which will be described later.

In this embodiment, a mounting table 632 has a convex sphere shape in a cross section, draws the substrate 1 by suction through suction ports 634, 635 and adsorbs the first substrate 1 to the mounting table 632.

The second substrate 2 is freely fallen and positioned on the first substrate 1 which is placed on the mounting table 632, so that the convex top of the first substrate 1 is adhered to the second substrate 2 as shown in FIG. 4(*a*). In this state, when it is started to join the substrates 1, 2, distortion is caused on the joining surfaces between a portion joined first and a portion joined after releasing the adsorption of the first substrate 1, and the substrates might not be bonded uniformly.

Therefore, according to the present invention, the suction by the mounting table 632 is stopped to release the adsorption of the first substrate 1. The first substrate 1 swings to resume its original flat shape, causing separation of the adhered points between the first and second substrates 1, 2. Thus, the uniform air layer 4 is formed between the joining surfaces of the first and second substrates 1, 2.

And, the first and second substrates 1, 2 are aligned with the uniform air layer 4 formed between the joining surfaces thereof. In this embodiment, a method of aligning the substrates with the OF section formed will be described.

Figure 5:
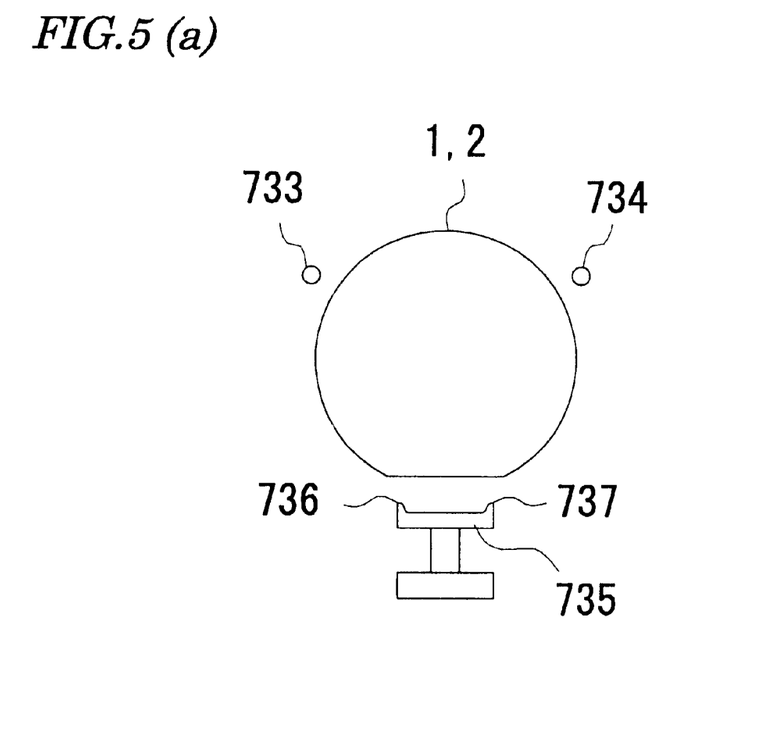
FIG. 5(a) is an explanatory diagram showing a state that two substrates are not aligned yet.
FIG. 5(b) is an explanatory diagram showing a state that the two substrates are aligned and held according to an embodiment of the invention.

As shown in FIGS. 5(*a*), 5(*b*), aligning pins 733, 734 and a pressing pin 735 are used to align the substrates.

The pressing pin 735 of this embodiment is provided with pressing points 736, 737 for horizontally holding the OF section of the substrates 1, 2 on two points. And, the pressing pin 735 can change its pressing force for aligning and holding the substrates 1, 2 by varying the pressing force of an unshown cylinder. The pressing force of the pressing pin 735 is varied to press the substrates 1, 2 by a force lower than that of joining the substrates 1, 2, and stably holds the substrates by the aligning pins 733, 734 and the pressing pin 735.

The pressing pin 735 of the present invention presses the substrates 1, 2 by a force lower than that of joining the substrates 1, 2 to align and hold them, so that a high quality product free from voids can be obtained without impairing the joining of the substrates 1, 2.

The pressing pin 735 of this embodiment horizontally holds the OF section of the substrates 1, 2 on two points, so that displacement of the substrates 1, 2 is decreased, contact points of the pressing pin 735 are decreased, and occurrence of voids can be decreased.

Lastly, the overlaid first and second substrates 1, 2 are pressed to be bonded in the same way as in the aforementioned step 3.

In this embodiment, the device combining the mounting table 632 for adsorbing the first substrate and the pressing pin 735 for aligning the substrates 1, 2 having the OF section, has been described. But, in addition, a device combining the mounting table 632 for adsorbing the substrate and the pressing pin 535 for aligning the substrates 1, 2 having a notch can be used. In this embodiment, description has been directed to the joining section only, but a scrub washing and drying device for removing particles adhered to the surface of a wafer may be disposed before the aligning step.

What is claimed is:

1. A method for bonding substrates to tightly adhere two overlaid substrates, comprising the steps of:

freely falling a second substrate onto a first substrate and aligning them;

interposing an air layer between the joining surfaces of the first and second substrates, aligning the first and second substrates and holding the two aligned substrates; and pressing one point of the two aligned substrates.

2. A method for bonding substrates according to claim 1, wherein:

in the step of interposing the air layer between the joining surfaces of the first and second substrates, and aligning them and holding the aligned first and second substrates, the alignment is made by pressing at least one of the first and second substrates to form the air layer between the joining surfaces of the first and second substrates.

3. A method for bonding substrates according to claim 1 or 2, wherein:

in the step of interposing the air layer between the joining surfaces of the first and second substrates, aligning them and holding the aligned first and second substrates, the first substrate is placed on a mounting table by adsorbing; and the adsorption of the first substrate is released to form the air layer between the joining surfaces of the first and second substrates.

4. A method for bonding substrates according to claim 1 or 2, wherein:

in the step of interposing the air layer between the joining surfaces of the first and second substrates, aligning them and holding the aligned first and second substrates, the alignment is performed by applying a pressing force to at least a part of the substrates and also to hold the substrates; and the pressing force is lower than a force of adhering the first and second substrates.

5. A method for bonding substrates according to claim 1 or 2, wherein the air layer interposed between the joining surfaces of the first and second substrates is uniform.

6. A method for bonding substrates according to claim 1 or 2, wherein:

in the step of interposing the air layer between the joining surfaces of the first and second substrates, aligning them and holding the aligned first and second substrates, the first substrate is adsorbed to be placed on the mounting table;

the adsorption of the first substrate is released to form the air layer between the joining surfaces of the first and second substrates; and the air layer interposed between the joining surfaces of the first and second substrates is uniform.

7. A method for bonding substrates according to claim 1 or 2, wherein:

in the step of interposing the air layer between the joining surfaces of the first and second substrates, aligning them and holding the aligned first and second substrates, the alignment is performed by applying a pressing force to at least a part of the substrates and also to hold the substrates;

the pressing force is lower than a force of adhering the first and second substrates; and the air layer interposed between the joining surfaces of the first and second substrates is uniform.

* * * * *